United States Patent [19]
Fellinger

[11] 4,424,497
[45] Jan. 3, 1984

[54] SYSTEM FOR PHASE LOCKING CLOCK SIGNALS TO A FREQUENCY ENCODED DATA STREAM

[75] Inventor: Michael W. Fellinger, Boulder, Colo.

[73] Assignee: Monolithic Systems Corporation, Englewood, Colo.

[21] Appl. No.: 259,020

[22] Filed: Apr. 30, 1981

[51] Int. Cl.³ .......................... H03L 7/08; H03D 3/18
[52] U.S. Cl. ..................................... 331/1 A; 329/50; 329/107; 329/122; 331/25; 360/51; 375/81; 375/120
[58] Field of Search .......................... 329/50, 122–124, 329/126, 104–105, 107; 375/80–82, 94, 110–111, 119–120; 360/51; 331/1 A, 25

[56] References Cited
U.S. PATENT DOCUMENTS 3,624,511 11/1971 Chin-Chun Sui .................. 329/122
4,017,806 4/1977 Rogers ........................... 329/107 X
4,030,045 6/1977 Clark ............................. 329/122 X Primary Examiner—William L. Sikes
Assistant Examiner—Edward P. Westin
Attorney, Agent, or Firm—Daniel M. Rosen

[57] ABSTRACT

In a system having a frequency encoded data stream and a source of clock signals phase locked to the data stream, for subsequent demodulation of the data stream, the clock source is at a frequency that is a multiple of the nominal frequency for demodulating, and a counter is employed to divide the clock. The counter is controlled by the output of a phase comparator, to control the addition to and inhibiting of counting of the counter. The control circuit controls the counter in a non-linear relationship with respect to the phase error, and has a memory function for storing previous states of the counter, to permit repetitive correction for small errors in the same manner. The phase comparator and control are preferably a programmed logic array.

12 Claims, 10 Drawing Figures

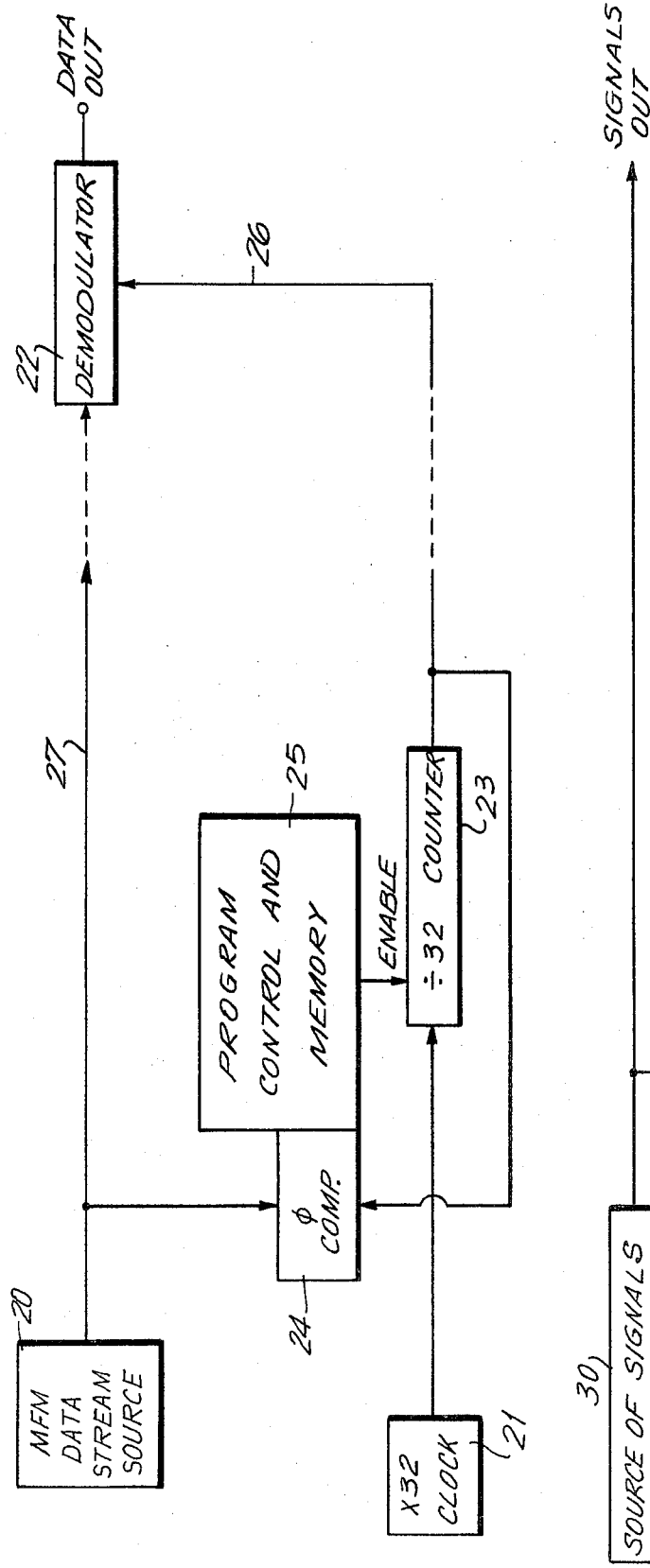
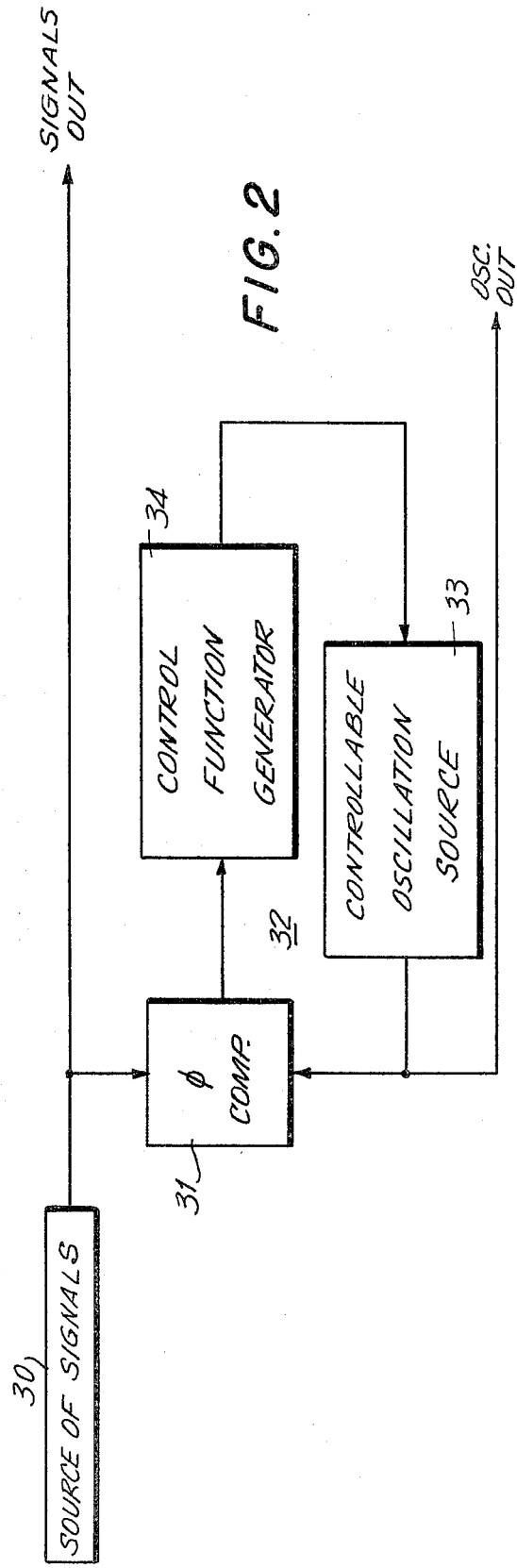
FIG.1
FIG.2

FIG.5
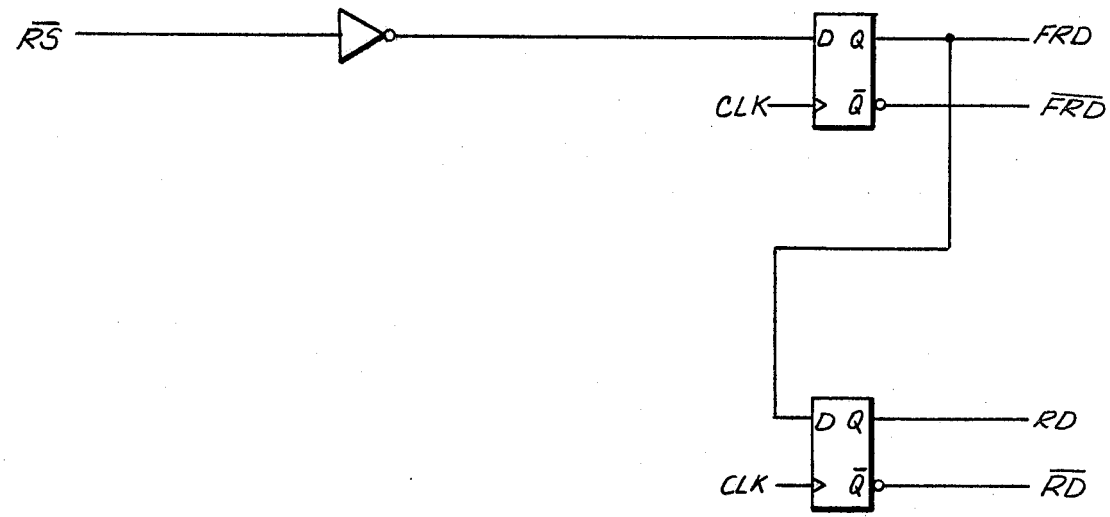
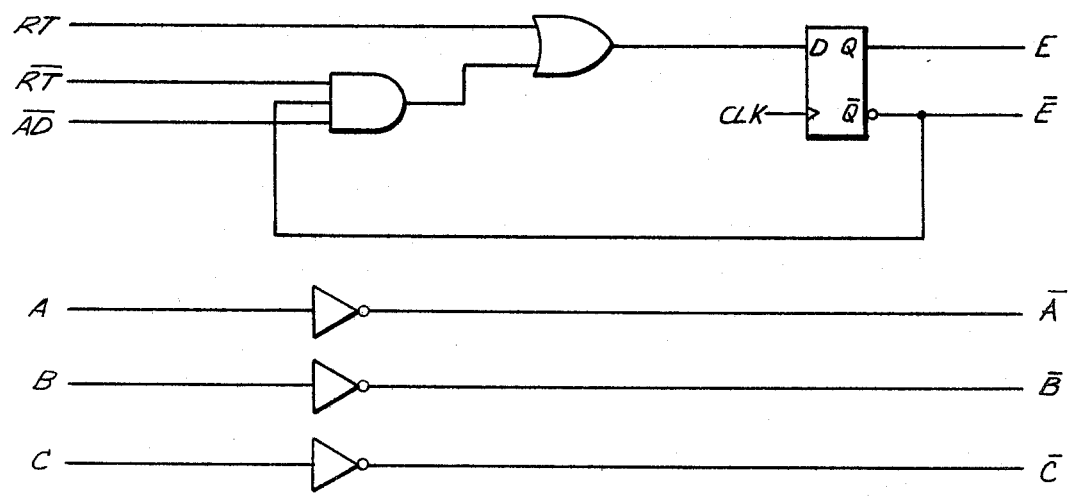

SYSTEM FOR PHASE LOCKING CLOCK SIGNALS TO A FREQUENCY ENCODED DATA STREAM

This invention relates to the control of oscillations of a clock source, and is particularly directed to a system for phase locking clock oscillations to a frequency encoded data stream.

In floppy disc systems, as well as other systems, data streams, for example, from a floppy disc controller, are frequency encoded. In such systems a clock is provided that is phase locked to the data stream. This clock is adapted to be employed in another circuit of the system, for decoding the data stream.

The present invention is directed to an apparatus for phase locking such a clock to a data stream, in a simple manner, and achieving additional advantages.

In a first embodiment of the invention, the clock is a multiple of the nominal demodulated frequency, and a dividing circuit or counter is employed to divide the output of a clock. A phase comparator for detecting phase errors is coupled to control a counter, to add counts or subtract counts. The phase comparison circuit, which may be comprised of a program logic array, has memory such that small phase errors of a consistent nature may be repetitively corrected in non-adjacent cycles of the clock, to effect an improved resolution.

In addition, a control function of the counter may be non-linear with respect to phase error. This nonlinearity may also be effected in the programmed logic array.

In order that the invention will be more clearly understood, it will now be disclosed in greater detail with reference to the accompanying drawings, wherein;

FIG. 1 is a simplified block diagram of a system in accordance with one embodiment of the invention;

FIG. 2 is a simplified block diagram of a system in accordance with a further embodiment of the invention;

FIGS. 5-10 are circuit diagrams of discrete circuits that may be employed alternatively in the invention.

Figure 3:
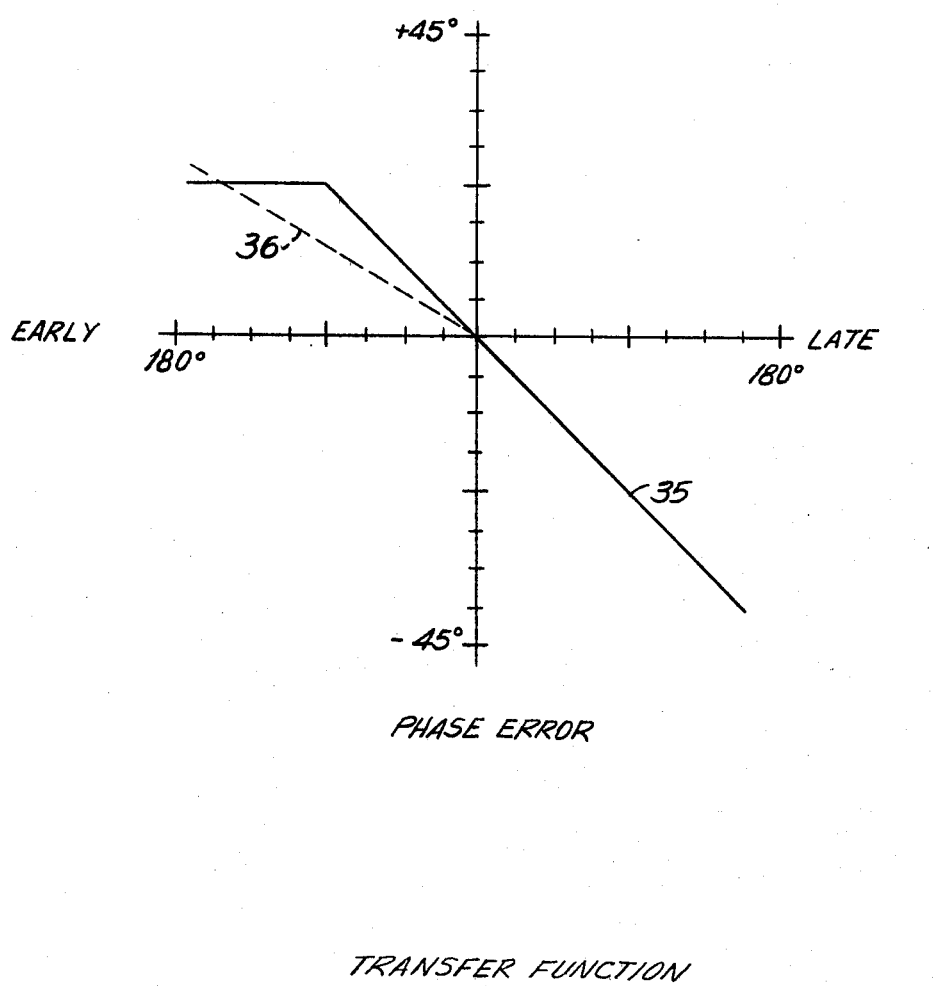
FIG. 3 is a diagram of the transfer function of the function generator of FIG. 2.

In accordance with one embodiment of the invention, as illustrated in the simplified block diagram of FIG. 1, a source 20 provides a frequency encoded data stream, i.e., an MFM data stream. Such signals are of the type provided, for example, in floppy disc interfaces. The system of FIG. 1 is further provided with a clock source 21, and the system is designed to phase lock the clock to the data stream, so that the clock may be employed in a further circuit to decode the data stream, for example, in a demodulator 22.

For this purpose, in accordance with the invention, the clock 21, which may be a crystal clock, is at a frequency that is a multiple, for example 32 times, the desired nominal frequency of the clock for the demodulator. The output of the clock 21 is thus applied to a divider 23, in the above case a divide-by-32 divider, to provide the output clock signals that are ultimately applied to the demodulator 22. The divider 23 is preferably in the form of a counter that may be controlled to miss counts or increase the number of counts, as will be disclosed in greater detail in the following paragraphs.

The output of the divider 23 is phase compared with the data stream in a phase comparator 24, the output of the comparator 24 being employed to control a program control and memory circuit 25. It is the function of the program control and memory circuit 25 to provide signals for controlling the divider 23 in dependence upon the relative phases detected by the phase comparator 24. As discussed above, phase errors are corrected by delaying or increasing the count of the counter comprising the divider 23. The program control memory 25 is connected to store the previous state of the counter, such that a small phase error of a consistent nature, for example, of 1/128 of the desired period, will cause the circuit to correct the phase every several cycles, in this case, every fourth cycle. As a result, the circuit acts as though the time resolution is a fraction of the desired nominal clock frequency, i.e., in this case ¼ of the nominal clock frequency. The system thereby reduces the quantification errors normally associated with digital phase lock systems.

As a consequence, the system in accordance with FIG. 1 provides a clock signal output, on the line 26, that is phase locked to the MFM data stream on line 27, to enable the accurate decoding of the data stream in the demodulator 22.

In a further embodiment of the invention, as illustrated in FIG. 2, source 30 is provided for signals, for example, the MFM data stream such as discussed with reference to FIG. 1. The signals from the source 30 are applied to the phase comparator 31 of a phase lock loop 32. The controllable oscillation source 33 is also coupled to the phase comparator 31, and the oscillation frequency of the source 33 is controlled as a function of the output of the phase comparator 31, as determined by the control function generator 34 connected therebetween. As a result, the oscillation output frequency of the source 33 varies with the frequency of the signals from source 30, in accordance with a function as determined by the function generator 34. In a conventional phase lock loop, a linear relationship exists between the phase error, as detected by the phase comparator, and the amount of phase correction of the oscillator. In the present invention, however, the relationship is intentionally made to be non-linear. The non-linearity, in accordance with one embodiment of the invention, is illustrated by the solid line curve 35 in FIG. 3. Thus, in accordance with the relationship illustrated in FIG. 3, if the phase error is large and in a direction such that the phase of oscillations from the source 33 should advance, then the gain or amount of correct is reduced, in comparison with purely linear relationship.

MFM data streams, for certain bit patterns, have a phenomenon known as "bit skewing," in which the data pulses do not arrive at their nominal times, but are "pulled" by the surrounding data pattern, so that they may appear either earlier or later than intended. Under most circumstances, for example, in the case of floppy disc interfaces, the bit timing errors are larger in the early direction than in the late direction.

In accordance with the invention, the phase lock loop of FIG. 2 is employed for correcting the phase of the clock, under such circumstances. Thus, the oscillation source 33 of FIG. 2 comprises a clock for the MFM system, which is employed in the same manner as in FIG. 1 for decoding the MFM data stream in a demodulator (not shown). The non-linear correction, in accordance with the invention, causes the circuit to be less sensitive to early data bits than to normal or late data bits. In other words, large phase errors in such a direction that the phase of the clock should be advanced, result in a reduced correction, as compared with a purely linar correction function, as illustrated by the transfer function of FIG. 3. As a consequence, in accordance with the invention, the phase error for the circuit is less than that of an equivalent linear circuit.

In other words, when data pulses arrive early, the "skew" phenomenon tends to exaggerate the phase error. Thus, if the phase difference between the recovered clock and the data is divided into that due to clock drift, that due to jitter in the data, and that due to the bit skew, the skew effect tends to amplify the error. Thus, the error in the early direction is larger than it would be without the skew effect. To compensate for this larger phase difference, in accordance with the invention, the gain of the phase detector is reduced when the data is early. The characteristic illustrated in FIG. 3 enables the circuit to perform in a manner superior to that of an arrangement having a linear transfer function, as has been shown by empirical tests. While the solid line curve of FIG. 3 does not provide an exact compensation for the skew effect, the characteristic illustrated in FIG. 3 is easily implemented and has been found to satisfactorily perform the desired function. Other compensation curves may alternatively be employed, if desired, and if the greater difficulty in implementing them is required. A quantitative theoretical treatment is not in general useful in this regard, since the skew occurs in the recording device, and is subject to many variations.

The correction effected by the non-linearity of the phase detector, in accordance with the invention, thus uses a technique in the timed domain, for the correction of skew errors, as opposed to the more conventional correction of time independent functions.

The transfer function 35 of FIG. 2 has been illustrated, since, especially in a digital phase lock loop, it is easy to implement. It will be understood, however, that other such non-linear functions may be employed, such as, for example, the dashed function 36 as also illustrated in FIG. 3.

Figure 4:
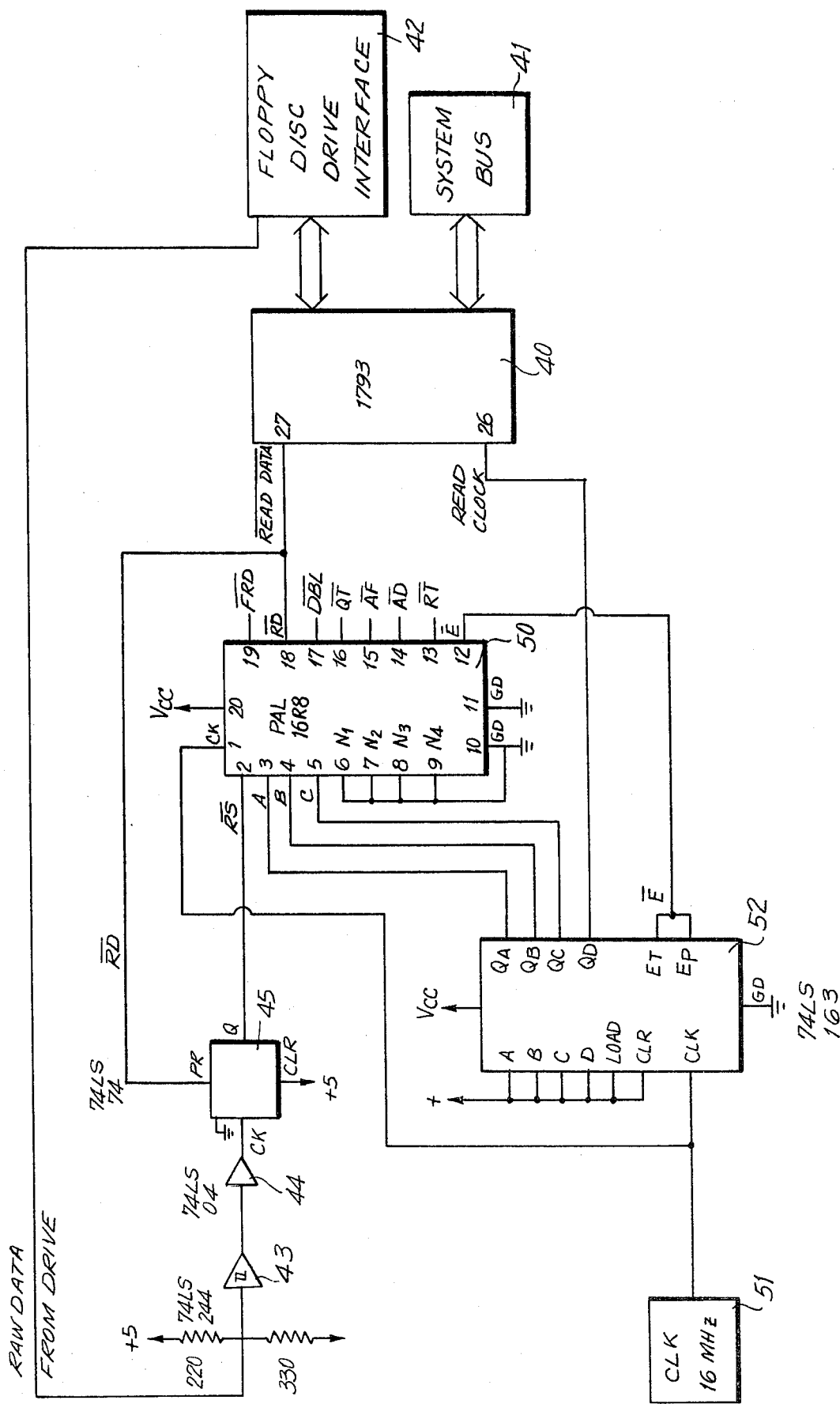
FIG. 4 is a block diagram of a portion of a floppy disc controller, embodying the systems of FIGS. 1 and 2.
Figure 6:
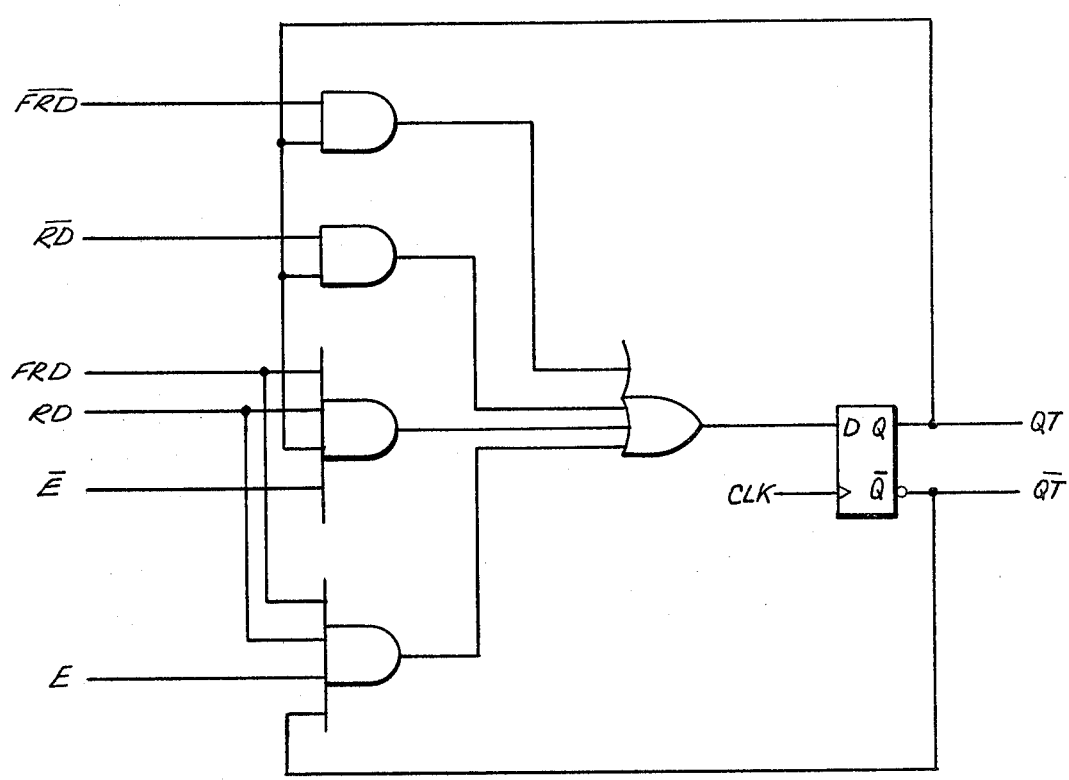
Figure 7:
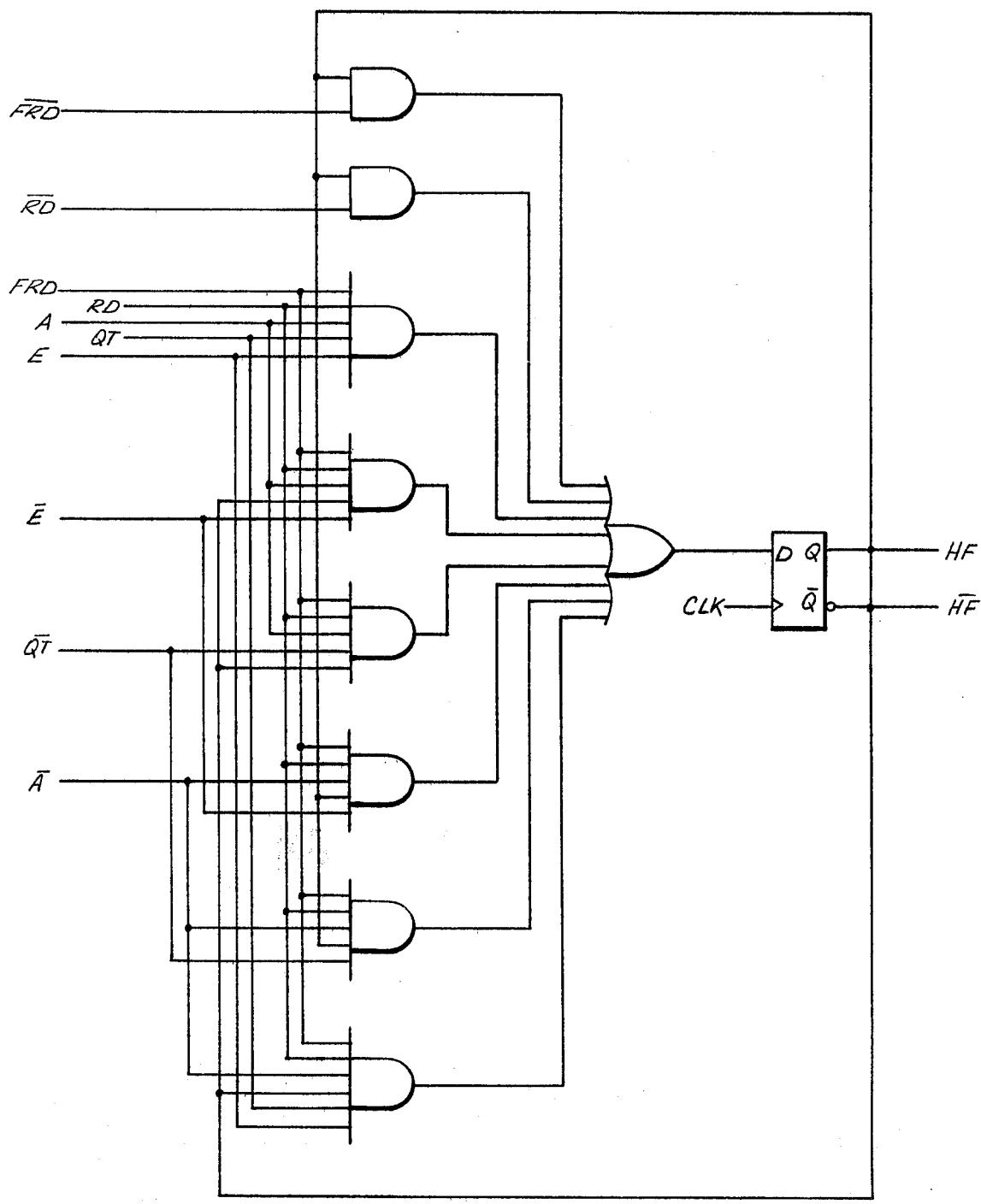
Figure 8:
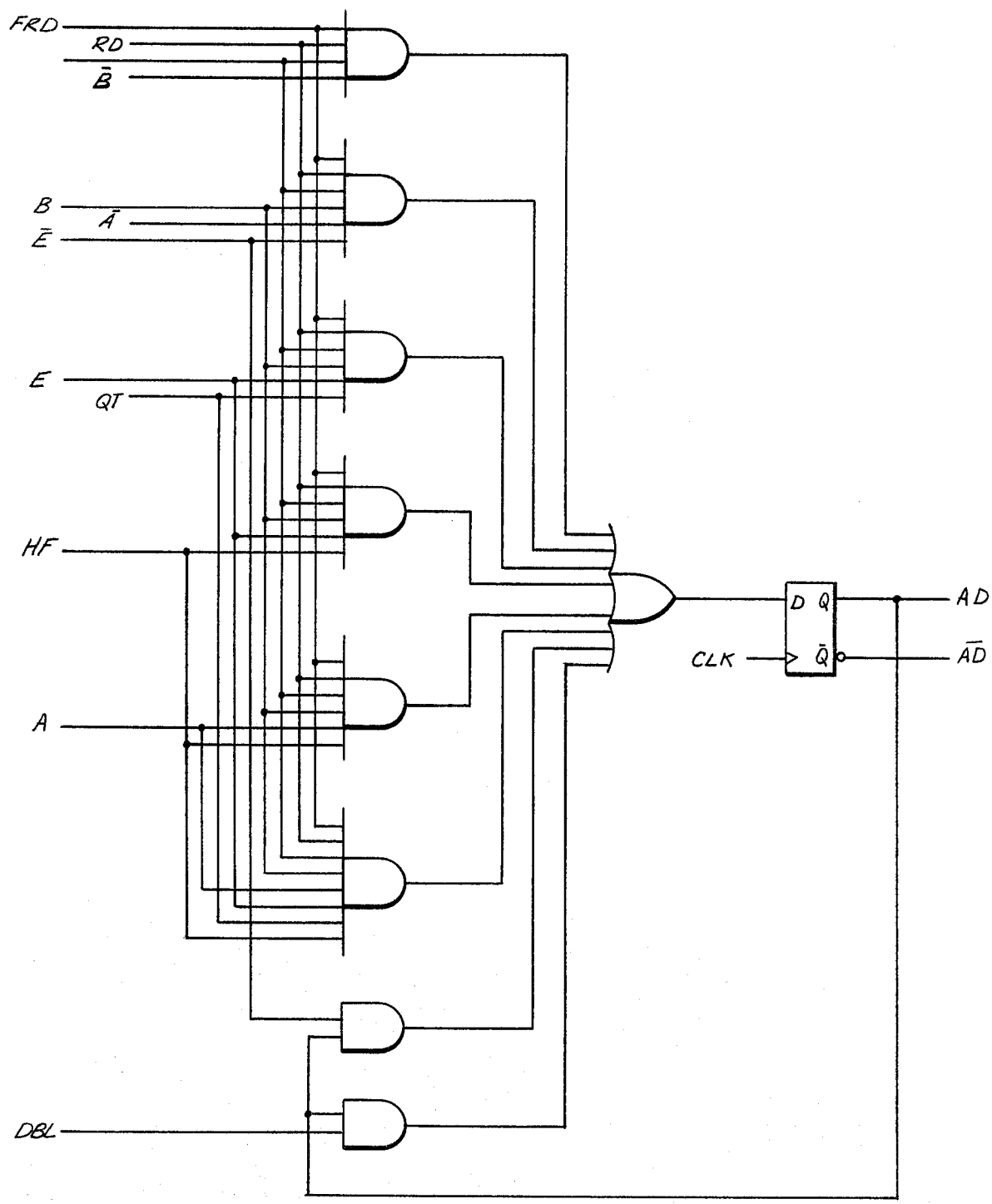
Figure 9:
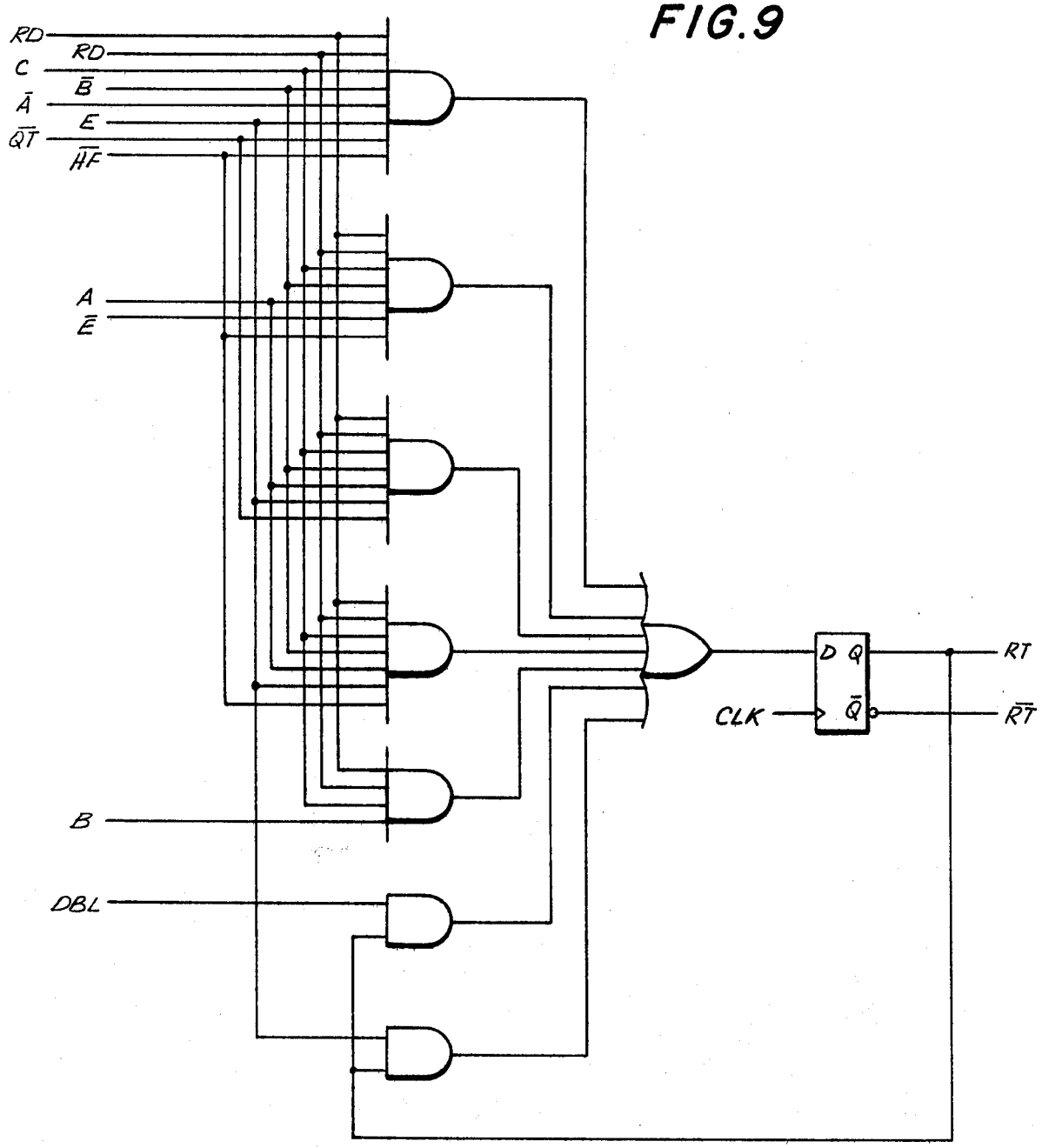
Figure 10:
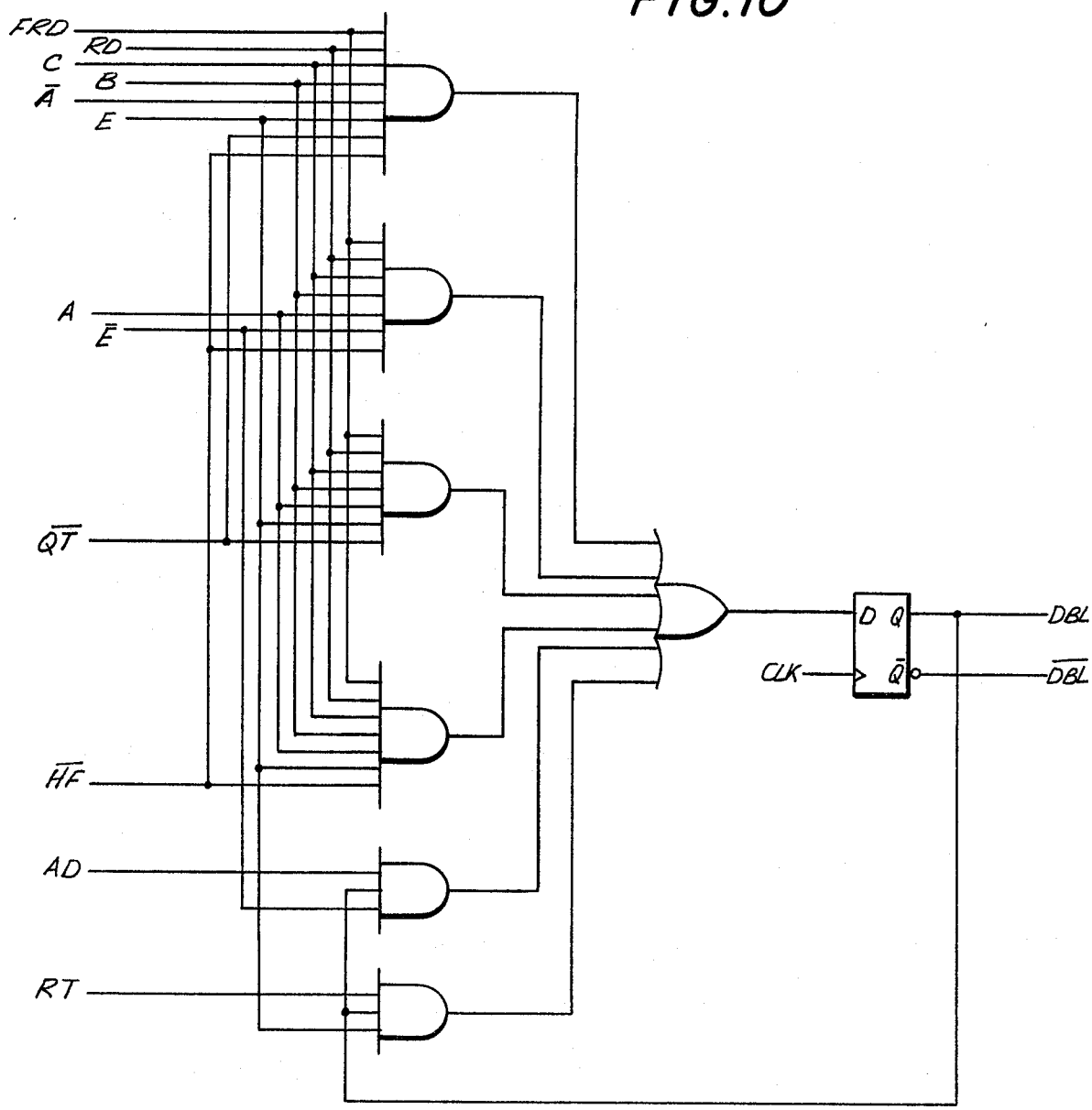

The arrangements of FIGS. 1 and 2 thus both are directed to the correction of a clock, especially for decoding an MFM data stream. These two correction arrangements are readily implemented, in a practical system, as shown in FIG. 4. FIG. 4 illustrated a floppy disc controlling system, wherein a conventional floppy disc control system 40, for example, a type 1793, is coupled in conventional manner to a system bus 41 and a floppy disc drive interface 42. Instead of being directed to the floppy disc controller 40, however, the raw data to be read from the drive interface 42 is applied to a signal shaper comprised of a buffer 43, an inverter 44, and a D-type flip-flop 45. The Q output of the flip-flop 45 is applied to an input terminal of program logic array 50, such as a type PAL16R8. The logic array 50 has fuses blown therein in a manner that will be disclosed in the following paragraphs.

The circuit clock 51, which may be a 16 MHz crystal control clock, is applied to the clock terminal of a synchronous counter 52. The counter may be of the type 74LS163. The divide by 2, divide by 4 and divide by 8 outputs of the counter 52, i.e., the A, B and C outputs, are also applied as inputs to the programmable logic array 50. The clock signal as applied to the counter 52 is also directed to the logic array 50. One output E of the logic array 50 is applied to the enable T and enable P controls of the counter 52, and the /RD output of the logic array 50 is applied both to the preset terminal of the flip-flop 45, and to the raw read input of the floppy disc controller 1793.

The illustrated counter 52 effects a division by 16. In the above discussed example, however, it was indicated that division by 32 was employed in this example of the invention. In the arrangement illustrated in FIG. 4, the additional division by 2 is effected since the enable lines ($E_t$, $E_p$) enable the counter only one half of the time, the signal for this purpose being derived from the PAL 50. The E output of the PAL 50 is normally toggled such that the counter counts on every other clock pulse. The consequence, this constitutes the fifth divide by 2 stage. To modulate the counter output, the duty factor of E is adjusted. Thus, leaving this signal high will cause the counter to cycle twice as fast, while leaving it low will completely stop the counter. As a consequence, any counting rate from zero to twice the nominal frequency input to the counter may be obtained in the system.

In the drawing, the logic array 50 is indicated as having additional outputs. These merely indicate the increments of intermediate signals on the terminals of logic array. The fuses of the logic array 50 are blown to provide the relationships indicated in table I, and the manner in which the fuses of the device are blown is indicated in appendix A affixed to this disclosure.

The clock frequency, as applied to the counter 52, may, for example, be 16 MHz for a double density 8 inch floppy disc drive, 8 MHz for a single density 8 inch drive or double density 5¼ inch drive, or 4 MHz for a single density 5¼ inch drive.

The phase comparator 24 of the basic embodiment of the invention as illustrated in FIG. 1, and the phase 31 of the basic embodiment of the invention as illustrated in FIG. 2 are incorporated in the logic array 50. The divider 23 of the embodiment of the invention illustrated in FIG. 1 is comprised of the counter 52 of FIG. 4, and the program control and memory 25 of the arrangement of FIG. 1 is also embodied in the logic array 50. The functions of the control function generator 34 of the embodiment of the invention of FIG. 2 are also incorporated in the logic array 50. The controllable oscillation source 33 as represented in the arrangement of FIG. 2 is analogous to the control the logic array 50 of FIG. 4 exerts over the output of the counter 52 of FIG. 4. It is thus apparent that the logic array 50 is organized to incorporate therein a number of the features of the embodiment of the invention illustrated in both FIGS. 1 and 2.

The logic performed by the array 50 may alternatively, of course, be performed by discrete integrated circuits. FIGS. 5–10 illustrate the circuits that may be employed for this purpose, with the signals being in accordance with the relationships table I.

TABLE I

E: = /AD * /RT * E + RT  
FRD: = RS  
RD: = FRD  
QT: = /FRD * QT + /RD * QT + FRD * RD * /QT * E + FRD * RD * QT * /E  
HF: = /FRD * HF + /RD * HF + FRD * RD * A * QT * E * HF  
  + FRD * RD * A * /HF * /E  
  + FRD * RD * A * /QT * /HF

TABLE I-continued

```
               + FRD * RD * /A * HF * /E
               + FRD * RD * /A * HF * /QT
               + FRD * RD * /A * /HF * QT * E
AD:  = FRD * RD * /C * /B
               + FRD * RD * /C * B * /A * /E
               + FRD * RD * /C * B * E * QT
               + FRD * RD * /C * B * E * HF
               + FRD * RD * /C * B * A * HF
               + FRD * RD * /C * B * A * E * QT * HF
               + AD * /E * /RT
               + AD * DBL * /RT
RT:  + FRD * RD * C * /B * /A * E * /QT * /HF
               + FRD * RD * C * /B * A * /E * /HF
               + FRD * RD * C * /B * A * E * /QT
               + FRD * RD * C * /B * A * E * /HF
               + FRD * RD * C * B
               + RT * E * /AD
               + RT * DBL * /AD
DBL: = FRD * RD * C * B * /A * E * /QT * /HF
               + FRD * RD * C * B * A * /E * /HF
               + FRD * RD * C * B * A * E * /QT
               + FRD * RD * C * B * A * E /HF
               + DBL * AD * /E * /RT
               + DBL * RT * E * /AD
```

Where:
+ = Logical OR
\* = Logical AND
/ = NOT

While the dividing of the clock by 32, as above discussed, is preferred, it will be apparent that advantageous relationships may be alternatively obtained by other division ratios.

The arrangement of the invention as illustrated in FIGS. 1 and 2 are of special importance in floppy disc systems, although it will be apparent that the same concepts may be employed in other magnetic recording systems employing MFM data streams. The arrangements may alternatively be employed for other purposes. It is further apparent that the arrangement of FIG. 2 may employ analog phase lock loop techniques, as well as the disclosed digital techniques.

While the invention has been disclosed and described with reference to a limited number of embodiments, it will be apparent that variations and modifications may be made therein, and it is intended in the following claims to cover each such variation and modification as follows within the true scope and spirit of the invention.

What is claimed is:

1. In a system having a frequency encoded data stream, a clock having an output at a given nominal frequency for demodulating the data stream, and means for phase locking the clock to the data stream; the improvement wherein said clock comprises a source of clock signals at a frequency that is a multiple of said nominal frequency, and dividing means for dividing said clock signals to produce said output, and wherein said means for phase locking comprises a phase comparator for comparing said output and data stream, and means responsive to the output of said comparator for selectively inhibiting or double counting in said dividing means.

2. The system of claim 1 wherein said means responsive to the output of said comparator comprises means for storing previous states of said dividing means whereby small phase errors of a consistent nature effect the control of said dividing means on each of a determined number of cycles of said clock signals.

3. The system of claim 2 wherein said dividing means comprises a synchronous counter, and said means for phase locking comprises a program logic array connected to receive said data stream and a plurality of pulse streams of multiples of said nominal frequency from said counter, and having an output coupled to enable and disable said counter.

4. The system of claim 3 wherein said logic array is connected to control said counter as a non-linear function of the relative phases between said data stream and clock.

5. The system of claim 4 wherein said non-linear function reduces the correction, as compared to a linear relationship, for phase errors that are in a direction such that the phase of the clock should advance for correction.

6. The system of claim 1 wherein said data stream comprises the data output of a floppy disc drive interface, and said dividing means divides said clock signals by 32.

7. In a system having a frequency encoded data stream, a clock having an output at a given nominal frequency for demodulating the data stream, and means for phase locking the clock to the data stream; the improvement wherein said clock comprises a controllable oscillation source, and said means for phase locking comprises a phase comparator for comparing the output of said source with said data stream, and a control function generator responsive to the output of said phase comparator for controlling the frequency of said source, whereby said phase comparator, control function generator and source comprise a phase lock loop, said control function generator controlling said oscillation source according to different functions in dependence upon the direction of the phase error between said data stream and the output of said source, said control function generator being connected to be less responsive to phase differences in a direction such that the phase of the output of said source should increase than to phase differences in the opposite direction.

8. The system of claim 7 wherein said phase comparator and control function generator comprise a program logic array.

9. The system of claim 8 wherein said oscillation source comprises a clock, and frequency dividing means for dividing the output of said clock, said control function generator being connected to selectively inhibit counts or add counts in said dividing means.

10. The system of claim 9 wherein said dividing means comprises a counter, and said program logic array includes means for remembering previous states in the counter such that small phase errors of a consistent nature cause correction of the counter on determined spaced apart cycles of said clock.

11. The system of claim 7 wherein said control function generator compensates for non-linearities in said system.

12. The system of claim 11 where said non-linearities are skew errors.

* * * * *

UNITED STATES PATENT AND TRADEMARK OFFICE
CERTIFICATE OF CORRECTION

PATENT NO. : 4,424,497
DATED : January 3, 1984
INVENTOR(S) : MICHAEL W. FELLINGER It is certified that error appears in the above—identified patent and that said Letters Patent is hereby corrected as shown below:

```
col. 1, line 21, change "a" to --the--;
        line 57, insert --of-- before "the".
Col. 2, line 43, change "curve" to --plot--;
        line 47, change "correct" to --correction--;
        line 48, insert --a-- after "with".
Col. 3, line 19, change "curve" to --plot--;
        line 34, change "2" to --3--;
        line 44, change "illustrated" to --illustrat-
        es--.
Col. 4, line 6, change "/RD" to --RD--;
        line 15, change "(E , E )" to --(E ,E )--;
                         t   p          T  p
        line 18, change "The" to --As a--;
        line. 26, change "the drawing" to --Fig. 4--;
        line 39, insert --comparator-- after "phase";
        line 60, insert --shown in-- before "table".
```

Signed and Sealed this

Twenty-sixth Day of March 1985

[SEAL]

Attest:

DONALD J. QUIGG

Attesting Officer     Acting Commissioner of Patents and Trademarks